United States Patent [19]

Harada

[11] Patent Number: 4,803,123
[45] Date of Patent: Feb. 7, 1989

[54] PROCESS FOR PRODUCTION OF FIBROUS CARBON MATERIAL

[75] Inventor: Junzo Harada, Chiba, Japan

[73] Assignee: Idemitsu Kosan Company Limited, Tokyo, Japan

[21] Appl. No.: 133,181

[22] Filed: Dec. 14, 1987

Related U.S. Application Data

[63] Continuation of Ser. No. 939,573, Dec. 9, 1986, abandoned.

[30] Foreign Application Priority Data

Dec. 16, 1985 [JP] Japan .............................. 60-281141

[51] Int. Cl.$^4$ .............................................. B05D 3/04
[52] U.S. Cl. ................................... 428/367; 423/345; 423/447.1; 423/447.7; 423/449; 428/365; 428/369
[58] Field of Search .................... 423/345, 346, 447.1, 423/447.2, 447.7, 449; 428/365, 367, 369

[56] References Cited

U.S. PATENT DOCUMENTS

| | | | |
|---|---|---|---|
| 2,992,901 | 7/1961 | Fisher et al. ........................ | 423/345 |
| 4,228,142 | 10/1980 | Holcombe et al. ................. | 423/449 |
| 4,572,902 | 2/1986 | Matano et al. ....................... | 501/97 |
| 4,596,741 | 6/1986 | Endou et al. ....................... | 428/367 |

FOREIGN PATENT DOCUMENTS

| | | | |
|---|---|---|---|
| 1185163 | 1/1965 | Fed. Rep. of Germany ...... | 423/449 |
| 53-147700 | 12/1978 | Japan .................................. | 423/345 |
| 59-35070 | 2/1984 | Japan ............................... | 423/447.2 |
| 59-9644 | 3/1984 | Japan ............................... | 423/447.2 |

OTHER PUBLICATIONS

Badami, X-Ray Studies of Graphite Formed by Decomposing Silicon Carbide, Carbon Journal, 1965, vol. 3 pp. 53 to 57.

*Primary Examiner*—John Doll
*Assistant Examiner*—Robert M. Kunemund
*Attorney, Agent, or Firm*—Walter H. Schneider

[57] ABSTRACT

A process for production of a fibrous carbon material is described, comprising contacting fibrous silicon carbide with a halogen element or a halogen compound to thereby remove a part or all of the silicon component contained in the fibrous silicon carbide. This fibrous carbon material is excellent in properties such as mechanical strength, thermal resistance and corrosion resistance and thus is useful as a plastic filler or for production of various industrial materials, for example.

1 Claim, 1 Drawing Sheet

PROCESS FOR PRODUCTION OF FIBROUS CARBON MATERIAL

This application is a continuation of application Ser. No. 939,573, filed Dec. 9, 1986, now abandoned.

BACKGROUND OF THE INVENTION

The present invention relates to a process for production of a fibrous carbon material and more particularly to a process for efficiently producing a light weight and high mechanical strength fibrous carbon material by applying a specified treatment to fibrous silicon carbide as a starting material, thereby removing at least one part of the silicon component from the fibrous silicon carbide.

Silicon carbide is used in production of various industrial materials because of its excellent thermal resistance, corrosion resistance and mechanical strength. In recent years, it has been increasingly used. In connection with the shape of silicon carbide, various forms such as a long fiber form, a short fiber form called "whisker" and a super fine powder form are known.

SUMMARY OF THE INVENTION

An object of the present invention is to provide a process for production from silicon carbide of a material which is lighter than silicon carbide and has a mechanical strength as high as that of the above fibrous silicon carbide.

It has been found that the object is attained by contacting fibrous silicon carbide as a starting material with a halogen element such as chlorine gas or a halogen compound such as phosgene to thereby remove a part or all of silicon contained in the silicon carbide.

The present invention relates to a process for producing a fibrous carbon material which comprises contacting fibrous silicon carbide with a halogen element or a halogen compound to thereby remove at least one part of the silicon component from the fibrous silicon carbide.

DETAILED DESCRIPTION OF THE INVENTION

Figure 1:
FIG. 1 is an electron micrograph of the traverse cross section of the fibrous carbon material obtained in Example 1.

In connection with silicon carbide to be used as a starting material in the process of the present invention, any type of silicon carbide can be used as long as it is in a fibrous form; any of α-type and β-type silicon carbides can be used. The length of the fibrous silicon carbide as used herein is usually not less than 1μ; silicon carbides having various forms from a whisker form (short fiber form) to a long fiber form can be used.

In accordance with the process of the present invention, the above fibrous silicon carbide is used as a starting material and is contacted with a halogen element or a halogen compound. Examples of the halogen element are fluorine, chlorine, bromine and iodine. This halogen element can be used in various forms such as a gas form (e.g., fluorine gas, chlorine gas and bromine gas), a liquid form, a solid form, and further as an aqueous solution such as chlorine water and bromine water. Typical examples of the halogen compound are phosgene, hydrogen fluoride, and organic halogen compounds such as Freon gas.

In accordance with the process of the present invention, the fibrous silicon carbide as a starting material is contacted with the above halogen element or halogen compound to thereby remove a part or all of the silicon component contained in the fibrous silicon carbide. Although the mechanism in which the silicon component is removed is not clear, it is believed that the halogen element or halogen in the halogen compound is bonded to silicon in the silicon carbide, thereby forming silicon halide, and that this silicon halide is released, resulting in removal of the silicon component.

Conditions under which the fibrous silicon carbid is contacted with the halogen element or halogen compound cannot be determined unconditionally because they vary depending on the proportion of the silicon component to be removed from the fibrous silicon carbide (silicon removal ratio), the type of the halogen element or halogen compound used, and so forth. The temperature is chosen appropriately from a temperature range of ordinary temperature to about 3,000° C., and the pressure may be subatmospheric or superatmospheric. The processing time is chosen appropriately from the range of several seconds to several ten hours.

In the process of the present invention, the silicon removal ratio of the fibrous silicon carbide can be controlled to a desired level by suitably choosing the processing conditions. When the silicon removal ratio is 100% or nearly 100%, the formed fibrous carbon material is carbonaceous nearly entirely from the central portion to the surface layer. The removal of silicon first occurs in the surface layer of the fibrous silicon carbide and then gradually toward the central portion. Thus if the silicon removal ratio is set at a certain level, for example, by introducing an inert gas such as argon, and helium in the processing system, there can be obtained a fibrous carbon material of the double structure that the inside is silicon carbide and the outside (near the surface) is carbon.

As representative of the process according to this invention, a fibrous carbon material of essentially the same diameter and length as the fibrous silicon carbide from which is produced and of double structure as above described, and having an average tensile modulus 20.9 to 27.4 ton/mm$^2$, an average elongation of 1.28 to 1.67% and an average surface area of $0.98 \times 10^2$ to $7.9 \times 10^2$ m$^2$/g can be obtained by charging fibrous silicon carbide having an outer diameter of 1.0 to 30μ and a length of 10–40 mm to a reaction chamber. An inert gas, e.g., helium, is then introduced into the reaction chamber and the temperature therein adjusted to no greater than about 800° C. While maintaining the adjusted temperature, the fibrous silicon carbide is subjected to an atmosphere of halogen or a halogen-containing compound for a period of time sufficient to remove silicon at a removal rate of 10–81%. The halogen or halogen-containing compound is then replaced with the inert gas, the temperature of the reaction chamber lowered to room temperature and the thus formed fibrous carbon material recovered.

In accordance with the process of the present invention, a fibrous carbon material as obtained by removal of silicon is made light weight and porous while maintaining its original form. This fibrous carbon material is excellent in properties such as mechanical strength, thermal resistance and corrosion resistance.

Accordingly the fibrous carbon material produced by the process of the present invention can be used effectively as various industrial materials, a plastic filler and so forth.

The present invention is described in greater detail with reference to the following example.

EXAMPLE 1

A quartz reaction tube (inner diameter: 35 millimeters (mm): length: 500 mm) was charged with 0.0385 gram (g) of β-type silicon carbide whiskers (outer diameter: 1.0 to 30 microns ($\mu$): length: 10 to 40 mm: specific density: 3.1. This quartz reaction tube was placed in an electric furnace in such a manner that the charge was positioned in the central portion of the electric furnace, and then the atmosphere of the reaction tube was replaced with helium gas. After replacement, the temperature was raised while flowing an inert gas (helium gas) until the temperature in the central portion reached 800° C.

While maintaining the temperature at 800° C., the inert gas was switched to chlorine gas (flow rate: 40 milliliters (ml) per minute (min) (ml/min) at 15° C.) and the silicon removal reaction was performed. After the reaction was performed for 4 minutes, the chlorine gas was switched to an inert gas (helium gas) and the temperature was lowered to room temperature. When the temperature reached room temperature, the reaction product was taken out and weighed. The weight of the reaction product was 0.0320 g. Based on a difference in weight between before and after the reaction, the silicon removal ratio was determined. Twenty samples (length: 10 mm) were taken out from the reaction product and measured for average diameter ($\mu$), average tensile strength (kilograms (kg) per square millimeter (mm) (kg/mm$^2$)), average tensile modulus (tons per square millimeter (ton/mm$^2$)) and elongation (%). The results are shown in Table 1.

Figure 2:
FIG. 2 is an electron micrograph of the vertical cross section of the fibrous carbon material obtained in Example 2.

An electron microscope of the traverse cross section (a cross section vertical to the axis) of the production (fibrous carbon material) is shown in FIG. 1, and an electron microscope of the vertical cross section (a cross section parallel to the axis) is shown in FIG. 2.

EXAMPLES 2 TO 4

The procedure of Example 1 was repeated with the exceptions that the amount of the β-type silicon carbide charged and the reaction time (chlorine introduction time) were changed. The results are shown in Table 1.

REFERENCE EXAMPLE

The procedure of Example 1 was repeated with the exception that the silicon removal reaction was not performed The results are shown in Table 1.

TABLE 1

|  | Example 1 | Example 2 | Example 3 | Example 4 | Reference Example |
|---|---|---|---|---|---|
| Reaction Conditions and Reaction Results |  |  |  |  |  |
| Amount of Silicon Carbide Whiskers Charged (g) | 0.0385 | 0.0385 | 0.0107 | 0.1077 | — |
| Reaction Time (min) | 4 | 23 | 37 | 101 | — |
| Weight of Product (g) | 0.0357 | 0.0320 | 0.0072 | 0.0467 | — |
| Difference in Weight (g) | 0.0028 | 0.0065 | 0.0035 | 0.061 | — |
| Silicon Removal Ratio*[1] (%) | 10 | 24 | 47 | 81 | — |
| Physical Properties of Product |  |  |  |  |  |
| Average Diameter ($\mu$) | 10.1 | 6.8 | 8.8 | 17.6 | 11.7 |
| Average Tensile Strength (kg/mm$^2$) | 393 | 334 | 356 | 310 | 350 |
| Average Tensile Modulus (ton/mm$^2$) | 25.3 | 22.8 | 27.4 | 20.9 | 30.5 |
| Average Elongation (%) | 1.67 | 1.49 | 1.28 | 1.60 | 1.14 |
| Average Surface Area (m$^2$/g)*[2] | 0.98 × 10$^2$ | 2.3 × 10$^2$ | 4.8 × 10$^2$ | 7.9 × 10$^2$ | 0.01*[3] |
| Sample Length (mm) | 10 | 10 | 10 | 10 | 10 |

*[1]Silicon Removal Ratio (%) = $\dfrac{\text{(Difference in Weight)}/28}{\text{(Amount of Silicon Carbide Whiskers charged)}/40}$ × 100 (%)
(chlorination ratio)

*[2]Measured by the nitrogen gas absorption method.
*[3]Calculated from the outer diameter and the sample length.

EXAMPLE 5

β-type silicon carbide whiskers (outer diameter: 26.4$\mu$; length: 32 mm) were chlorinated for 1 hour under the same conditions as in Example 1 and after switching to the inert gas, the temperature was lowered to room temperature. After the temperature reached room temperature, the product was taken out and measured for outer diameter and length. The outer diameter was 24.6$\mu$ and the length was 32 mm. The outer diameter retaining ratio was 93%.

EXAMPLE 6

β-type silicon carbide whiskers (outer diameter 25.3$\mu$; length: 33.5 mm) were chlorinated for 1 hour under the same conditions as in Example 1 and after switching to the inert gas, the temperature was lowered to room temperature. After the temperature reached room temperature, the product was taken out and measured for outer diameter and length. The outer diameter and the length was 33.5 mm. The outer diameter retaining ratio was 93%.

EXAMPLE 7

β-type silicon carbide whiskers (outer diameter 13.2$\mu$; length: 30 mm) were chlorinated for 1 hour under the same conditions as in Example 1 and after switching to the inert gas, the temperature was lowered to room temperature After the temperature reached room temperature, the product was taken out and measured for outer diameter and length. The outer diameter was 11.8$\mu$ and the length was 30 mm. The outer diameter-retaining ratio was 89%.

It can be seen from the above results that even after one hour chlorination (treatment for removal of silicon), the length remains unchanged and in connection with the outer diameter, a shrinkage of about 7 to 11% only is observed.

Based on the results regarding the average surface area shown in Table 1, it is considered that the carbon material produced by the process of the present invention has a very large surface area and is in a porous state.

What is claimed is:

1. A process for producing a fibrous carbon material from fibrous silicon carbide, said fibrous carbon material being of double structure in that the inside thereof near its core is silicon carbide and the outside thereof near its surface is carbon, said fibrous carbon material further being of essentially the same diameter and length as said fibrous silicon carbide but lighter in weight and having an average tensile modulus of 20.9 to 27.4 ton/mm$^2$, an average elongation of 1.28 to 1.67% and an average surface area of from $0.98 \times 10^2$ to $7.9 \times 10^2$ m$^2$/g, which comprises: charging said fibrous silicon carbide having an outer diameter of from 1.0 to 30$\mu$ and a length of from 10 to 40 mm to a reaction chamber; introducing an inert gas into said reaction chamber and adjusting the temperature therein to no greater than aobut 800° C.; while maintaining said temperature, contacting said fibrous silicon carbide with a halogen or halogen-containing compund for a period of time sufficient to remove the silicon therefrom at a silicon removal rate of 10 to 81%; replacing the halogen or halogen-containing compound with inert gas; lowering the temperature in said reaction chamber to about room temperature and removing the thus formed fibrous carbon material therefrom.

\* \* \* \* \*